US012451326B2

(12) United States Patent
Ikeda et al.

(10) Patent No.: US 12,451,326 B2
(45) Date of Patent: Oct. 21, 2025

(54) PLASMA PROCESSING APPARATUS AND PLASMA PROCESSING METHOD

(71) Applicants: TOKYO ELECTRON LIMITED, Tokyo (JP); TOHOKU UNIVERSITY, Miyagi (JP)

(72) Inventors: Taro Ikeda, Nirasaki (JP); Satoru Kawakami, Nirasaki (JP); Masaki Hirayama, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 802 days.

(21) Appl. No.: 17/299,979

(22) PCT Filed: Nov. 26, 2019

(86) PCT No.: PCT/JP2019/046211
§ 371 (c)(1),
(2) Date: Jun. 4, 2021

(87) PCT Pub. No.: WO2020/116245
PCT Pub. Date: Jun. 11, 2020

(65) Prior Publication Data

US 2021/0375588 A1 Dec. 2, 2021

(30) Foreign Application Priority Data

Dec. 6, 2018 (JP) ................................ 2018-229222

(51) Int. Cl.
*H01J 37/32* (2006.01)

(52) U.S. Cl.
CPC ..... *H01J 37/32091* (2013.01); *H01J 37/3244* (2013.01); *H01J 37/32715* (2013.01); *H01J 2237/3321* (2013.01); *H01J 2237/334* (2013.01)

(58) Field of Classification Search
USPC .................................................... 156/345.34
See application file for complete search history.

(56) References Cited

U.S. PATENT DOCUMENTS 7,585,386 B2 * 9/2009 Okumura .......... H01J 37/32541 118/724
2012/0206033 A1 * 8/2012 Matsuyama ...... H01J 37/32623 313/355
2015/0097486 A1 * 4/2015 Nguyen ............ H01J 37/32082 239/548

FOREIGN PATENT DOCUMENTS

CN 107435139 * 12/2017 .......... H01J 37/3244
JP 9-312268 A 12/1997

(Continued)

*Primary Examiner* — Ram N Kackar
(74) *Attorney, Agent, or Firm* — Nath, Goldberg & Meyer; Jerald L. Meyer; Tanya E. Harkins

(57) ABSTRACT

In a plasma processing apparatus and a plasma processing method, improvement of the in-plane uniformity of plasma on a stage is required. The plasma processing apparatus includes a processing container, a stage, and a dielectric plate. The stage is provided within the processing container, the dielectric plate includes a plurality of through-holes for gas injection, and an upper surface of the dielectric plate is provided with a conductive film. A space between the conductive film and the stage within the processing container is used as a plasma processing space. The dielectric plate has a central portion and an outer peripheral portion, upper surfaces of the central portion and the outer peripheral portion include flat portions, and the central portion is larger in thickness than the outer peripheral portion.

4 Claims, 3 Drawing Sheets

(56) References Cited

FOREIGN PATENT DOCUMENTS

| | | | | |
|---|---|---|---|---|
| JP | 2000-323456 A | | 11/2000 | |
| JP | 2005-228973 A | | 8/2005 | |
| JP | 2009-004713 A | | 1/2009 | |
| JP | 4364667 B2 | | 8/2009 | |
| JP | 5317992 B2 | | 7/2013 | |
| JP | 5367000 B2 | | 9/2013 | |
| JP | 2014-53309 A | | 3/2014 | |
| JP | 5513104 B2 | | 4/2014 | |
| JP | 2016-195150 A | | 11/2016 | |
| KR | 10-2007-0007428 A | | 1/2007 | |
| KR | 10-2016-0026770 | * | 3/2016 | ........ H01J 37/32422 |

* cited by examiner

PLASMA PROCESSING APPARATUS AND PLASMA PROCESSING METHOD

This is a National Phase application filed under 35 U.S.C. 371 as a national stage of PCT/JP2019/046211, filed Nov. 26, 2019, an application claiming the benefit of Japanese Application No. 2018-229222, filed Dec. 6, 2018, the content of each of which is hereby incorporated by reference in its entirety.

TECHNICAL FIELD

Exemplary embodiments of the present disclosure relate to a plasma processing apparatus and a plasma processing method.

BACKGROUND

In manufacturing electronic devices, a plasma processing apparatus is used. A type of plasma processing apparatus is disclosed in Patent Document 1. Other plasma processing apparatuses are disclosed in Patent Documents 2 to 8. As a plasma processing apparatus, a capacitively coupled plasma processing apparatus is known. As the capacitively coupled plasma processing apparatus, a plasma processing apparatus that uses radio frequency waves having a frequency in the very-high-frequency (VHF) band for plasma generation is attracting a lot of attention. The VHF band is a frequency band in a range of about 30 MHz to 300 MHz.

PRIOR ART DOCUMENTS

Patent Documents

Patent Document 1: Japanese Laid-Open Patent Publication No. 2016-195150

Patent Document 2: Japanese Laid-Open Patent Publication No. H09-312268

Patent Document 3: Japanese Laid-Open Patent Publication No. 2014-053309

Patent Document 4: Japanese Laid-Open Patent Publication No. 2000-323456

Patent Document 5: Japanese Patent No. 4364667

Patent Document 6: Japanese Patent No. 5317992

Patent Document 7: Japanese Patent No. 5367000

Patent Document 8: Japanese Patent No. 5513104

In a plasma processing apparatus and a plasma processing method, improvement in in-plane uniformity of plasma on a stage is required.

SUMMARY

In an exemplary embodiment, a plasma processing apparatus includes a processing container, a stage, and a dielectric plate. The stage is provided within the processing container, the dielectric plate includes a plurality of through-holes for gas injection, and an upper surface of the dielectric plate is provided with a conductive film. A space between the conductive film and the stage within the processing container is used as a plasma processing space. The dielectric plate has a central portion and an outer peripheral portion, upper surfaces of the central portion and the outer peripheral portion include flat portions, and the central portion is larger in thickness than the outer peripheral portion.

With a plasma processing apparatus and a plasma processing method according to an exemplary embodiment, it is possible to improve the in-plane uniformity of plasma on a stage.

DETAILED DESCRIPTION

Figure 1:
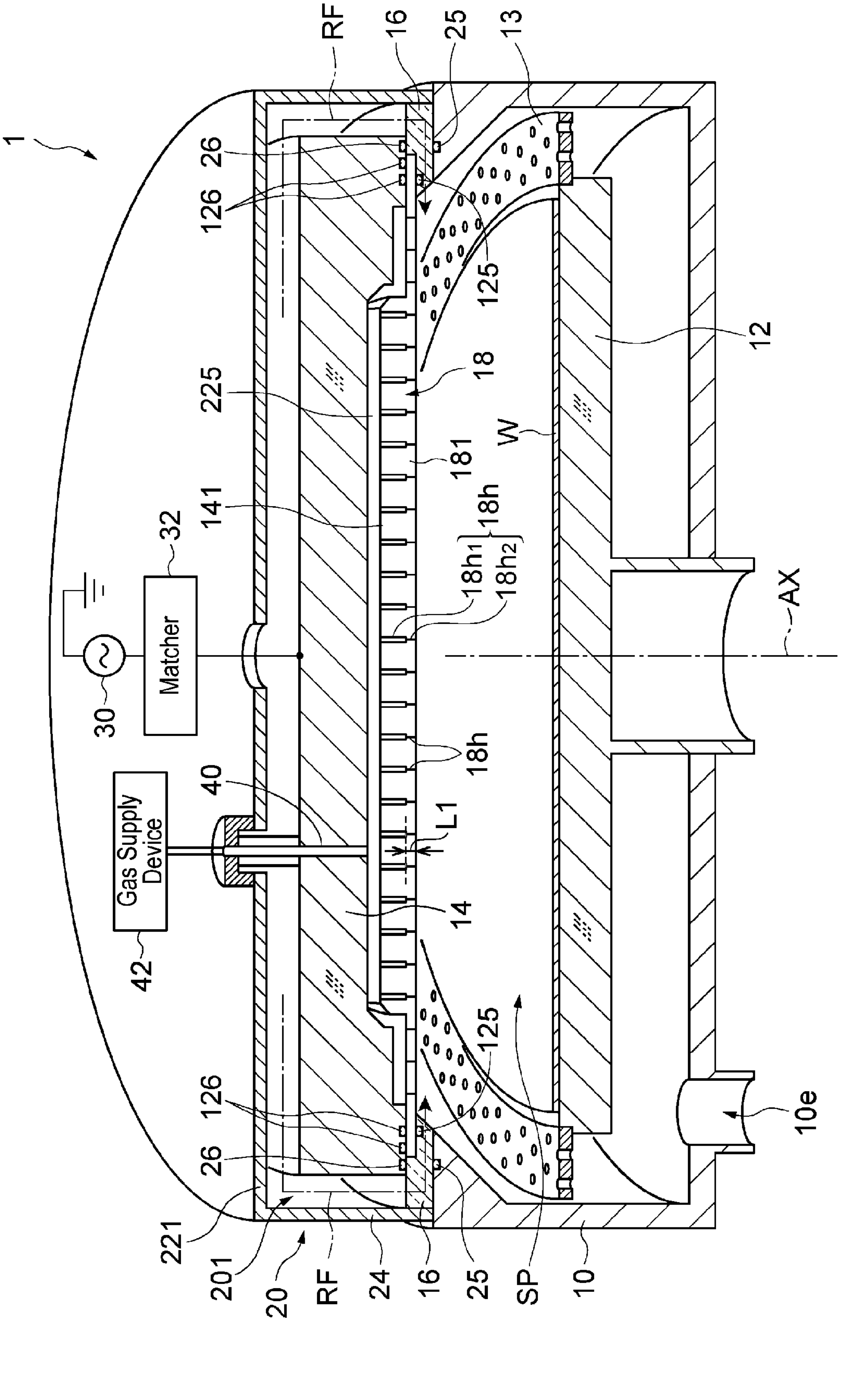
FIG. 1 is a view schematically illustrating a plasma processing apparatus according to an exemplary embodiment.

Hereinafter, various exemplary embodiments will be described.

In an exemplary embodiment, a plasma processing apparatus includes a processing container, a stage, and a dielectric plate. The stage is provided within the processing container. The dielectric plate includes a plurality of through-holes for gas ejection. An upper surface of the dielectric plate is provided with a conductive film. A space between the conductive film and the stage within the processing container corresponds to a plasma processing space. The dielectric plate has a central portion and an outer peripheral portion. Upper surfaces of the central portion and the outer peripheral portion constitute flat portions. The central portion has a thickness larger than that of the outer peripheral portion.

Sheath electric fields that generate plasma tend to be strong in the central portion of the stage, and tend to be weak in the outer peripheral portion since electric field vectors are inclined. In the outer peripheral portion, a thickness of an upper surface of the conductive film is set as described above. The conductive film functions as an upper electrode during plasma generation, which forms electric fields via the dielectric plate located directly below the conductive film so as to correct the strength of the electric field vectors, thus improving the in-plane uniformity of sheath electric fields. This improves the in-plane uniformity of plasma. In addition, the upper surface of the central portion is flat, and the upper surface of the outer peripheral portion is also flat. Since the flat surfaces are easy to process, it is possible to achieve the above-mentioned effects only by forming a stepped portion at a boundary between the flat surfaces.

In an exemplary embodiment, the through-holes may be formed in the flat portions. Since the through-holes in the flat portions are easy to process, it is possible to arrange the through-holes at accurate desired positions.

In an exemplary embodiment, the dielectric plate includes a transition portion formed as a stepped portion between the central portion and the outer peripheral portion. A thickness of the conductive film on the transition portion is different from that of the conductive film on the flat portion. When a sputtering method is used, angles at which the material of the conductive film collides with the dielectric plate are different. Due to the angle of the material of the conductive film from the direction along the normal of the surface of the conductive film, the thickness of the conductive film is larger in the transition portion than in the flat portions. When the thickness is large, the effect of reducing the resistance to a current flowing perpendicularly in the thickness direction is obtained.

In an exemplary embodiment, the through-holes in the conductive film are arranged at the positions of the through-holes in the dielectric plate and have a tapered shape having a diameter that becomes smaller in the direction toward the dielectric plate. Since the through-holes in the conductive film have a tapered shape, a gas easily flows into the through-holes in the dielectric plate, and the material of the conductive film hardly affects the gas passing through the through-holes in the dielectric plate.

In an exemplary embodiment, a plasma processing method using the above-described plasma processing apparatus includes the following steps. That is, the method includes a step of placing a substrate under the dielectric plate and a step of generating plasma by applying a radio-frequency voltage to the conductive film (between the conductive film and a fixed potential such as ground) so as to process the surface of the substrate. In this case, it is possible to process the substrate with high in-plane uniformity.

Hereinafter, various exemplary embodiments will be described in detail with reference to the drawings. In each of the drawings, the same or corresponding parts will be denoted by the same reference numerals, and a redundant description thereof will be omitted.

FIG. 1 is a view schematically illustrating the plasma processing apparatus according to an exemplary embodiment. The plasma processing apparatus 1 illustrated in FIG. 1 includes a processing container 10, a stage 12, an upper electrode 14, a shower plate 18 having a conductive film 141 (an upper electrode), and an introduction portion 16.

The processing container 10 has a substantially cylindrical shape. The processing container 10 extends in the vertical direction. A central axis line of the processing container 10 is an axis line AX extending in the vertical direction. The processing container 10 is formed of a conductor such as aluminum or an aluminum alloy. A corrosion-resistant film is formed on the surface of the processing container 10. The corrosion-resistant film is formed of ceramic such as aluminum oxide or yttrium oxide. The processing container 10 is grounded.

The stage 12 is provided within the processing container 10. The stage 12 is configured to support a substrate W placed on the upper surface thereof in a substantially horizontal posture. The stage 12 has a substantially disk-like shape. A central axis line of the stage 12 substantially coincides with the axis line AX.

The plasma processing apparatus 1 may further include a baffle member 13. The baffle member 13 extends between the stage 12 and the side wall of the processing container 10. The baffle member 13 is a substantially annular plate material. The baffle member 13 is formed of an insulator such as aluminum oxide. A plurality of through-holes are formed in the baffle member 13. The plurality of through-holes penetrate the baffle member 13 in the thickness direction thereof. An exhaust port 10*e* is formed in the processing container 10 below the stage 12. An exhaust device is connected to the exhaust port 10*e*. The exhaust device includes a pressure control valve and a vacuum pump such as a turbo molecular pump and/or a dry pump.

The upper electrode 14 is provided above the stage 12, with a space SP (a plasma processing space) within the processing container 10 interposed between the upper electrode 14 and the stage 12. The upper electrode 14 is formed of a conductor such as aluminum or an aluminum alloy. The upper electrode 14 has a substantially disk-like shape. A central axis line of the upper electrode 14 substantially coincides with the axis line AX. The plasma processing apparatus 1 is configured to generate plasma in the space SP between the stage 12 and the upper electrode 14.

The plasma processing apparatus 1 further includes the shower plate 18. The shower plate 18 is provided directly below the upper electrode 14. The shower plate 18 faces the upper surface of the stage 12 across the space SP. The space SP is a space between the shower plate 18 and the stage 12. A main body of the shower plate 18 is an upper dielectric 181 (the dielectric plate). The shower plate 18 has a substantially disk-like shape. A central axis line of the shower plate 18 substantially coincides with the axis line AX. A plurality of gas ejection holes 18*h* are formed in the shower plate 18 in order to evenly supply gas to the entire surface of the substrate W placed on the stage 12. A distance in the vertical direction between a lower surface of the shower plate 18 and the upper surface of the stage 12 is, for example, 5 cm to 10 cm, or 30 cm or less.

In the plasma processing apparatus 1, the area of the inner wall surface of the processing container 10 extending above the baffle member 13 is substantially equal to the surface area of the shower plate 18 at the side of the space SP. That is, the area of a surface set to ground potential (a ground surface) among the surfaces defining the space SP is substantially equal to the area of the surface provided by the shower plate 18 among the surfaces defining the space SP. With this configuration, plasma is generated at a uniform density in a region directly below the shower plate 18 and a region around the ground surface. As a result, in-plane uniformity of plasma processing of the substrate W is improved.

The introduction portion 16 is provided outside the peripheral edge of the shower plate 18. That is, the introduction portion 16 has an annular shape. The introduction portion 16 is a portion through which the radio-frequency waves are introduced into the space SP. The radio-frequency waves are VHF waves. The introduction portion 16 is provided at the lateral end portion of the space SP. The plasma processing apparatus 1 further includes a waveguide portion 20 (a waveguide passage RF) in order to supply the radio-frequency waves to the introduction portion 16.

The waveguide portion 20 provides a tubular waveguide 201 extending in the vertical direction. A central axis line of the waveguide 201 substantially coincides with the axis line AX. A lower end of the waveguide 201 is connected to the introduction portion 16.

A radio-frequency power supply 30 is electrically connected to an upper surface of the upper electrode 14 constituting the inner wall of the waveguide portion 20 via a matcher 32. The radio-frequency power supply 30 is a power supply that generates the above-mentioned radio-frequency waves. The matcher 32 includes a matching circuit configured to match a load impedance of the radio-frequency power supply 30 with an output impedance of the radio-frequency power supply 30.

The waveguide 201 is provided by a space between an outer peripheral surface of the upper electrode 14 and an inner surface of a cylindrical member 24, which may be made of a conductor such as aluminum or an aluminum alloy.

The introduction portion 16 is elastically supported between the bottom surface of the outer peripheral region of the upper electrode 14 and the upper end surface of the main body of the processing container 10. A sealing member 25 is interposed between the bottom surface of the introduction portion 16 and the upper end surface of the main body of the processing container 10. A sealing member 26 is interposed between the upper surface of the introduction portion 16 and the bottom surface of the outer peripheral region of the upper electrode 14. Each of the sealing member 25 and the sealing member 26 has elasticity. Each of the sealing member 25 and the sealing member 26 extends circumferentially around the axis line AX. Each of the sealing member 25 and the sealing member 26 is, for example, a rubber-made O-ring.

The cylindrical member 24 is formed of a conductor such as aluminum or an aluminum alloy. The cylindrical member 24 has a substantially cylindrical shape. A central axis line of the cylindrical member 24 substantially coincides with the axis line AX. The cylindrical member 24 extends in the vertical direction. A lower end of the cylindrical member 24 is connected to the upper end of the processing container 10, and the processing container 10 is grounded. Therefore, the cylindrical member 24 is grounded. At the upper end of the cylindrical member 24, an upper wall portion 221 constituting a waveguide passage RF together with the upper surface of the upper electrode 14 is located. In addition, the waveguides provided by the waveguide portion 20 are constituted with grounded conductors.

The lower surface of the upper electrode 14 is provided with a recess. A gas diffusion space 225 is defined between the upper electrode 14 and the shower plate 18 as a dielectric plate. A pipe 40 is connected to the gas diffusion space 225. A gas supply device 42 is connected to the pipe 40. The gas supply device 42 includes one or more gas sources used for processing the substrate W. In addition, the gas supply device 42 includes one or more flow controllers configured to control flow rates of gases from the one or more gas sources, respectively.

The pipe 40 extends to the gas diffusion space 225 through a waveguide of the waveguide portion 20. As described above, all of the waveguides provided by the waveguide portion 20 are constituted with grounded conductors. Therefore, the excitation of gas within the pipe 40 is suppressed. A gas supplied to the gas diffusion space 225 is ejected into the space SP through the plurality of gas ejection holes **18*h* in the shower plate 18**.

In the plasma processing apparatus 1, the radio-frequency waves are supplied from the radio-frequency power supply 30 to the introduction portion 16 through the waveguides of the waveguide portion 20. The radio-frequency waves are VHF waves. The radio-frequency waves may be UHF waves. The radio-frequency waves are introduced into the space SP from the introduction portion 16 toward the axis line AX. The radio-frequency waves are introduced into the space SP from the introduction portion 16 with uniform power in the circumferential direction. When the radio-frequency waves are introduced into the space SP, the gas is excited within the space SP, and plasma is generated from the gas. Accordingly, the plasma is generated in the space SP with a uniform density distribution in the circumferential direction. The substrate W on the stage 12 is processed with chemical species from the plasma.

The stage 12 is provided with a conductive layer for an electrostatic chuck and a conductive layer for a heater. The stage 12 has a main body, the conductive layer for the electrostatic chuck, and the conductive layer for the heater. The main body may be made of a conductor, such as aluminum, for functioning as a lower electrode. As an example, the main body may be made of an insulator such as aluminum nitride. The main body has a substantially disk-like shape. A central axis line of the main body substantially coincides with the axis line AX. The conductive layer of the stage is made of a conductive material such as tungsten. The conductive layer is provided inside the main body. The stage 12 may have one or more conductive layers. When a DC voltage from a DC power supply is applied to the conductive layer for the electrostatic chuck, an electrostatic attractive force is generated between the stage 12 and the substrate W. The substrate W is attracted to the stage 12 by the generated electrostatic attractive force, and is held by the stage 12. In another embodiment, the conductive layer may be a radio-frequency electrode. In this case, a radio-frequency power supply is electrically connected to the conductive layer via a matcher. In yet another embodiment, the conductive layer may be an electrode that is grounded. The conductive layer embedded in such an insulator may also function as a lower electrode for forming an electric field at a boundary between the conductive layer and the upper electrode.

In the embodiment, the shower plate 18 made of a dielectric is disposed below the upper wall constituting the upper electrode 14 (which is bulky) of the processing container 10 via the gas diffusion space 225. The lower surface of the upper wall has a recess. The gas from the gas supply device 42 flows through the recess. The pipe 40 is connected to the gas diffusion space 225 in the recess. The gas ejection holes **18*h* of the shower plate 18 are located below the gas diffusion space 225**. The shape of one or more recesses may be a circular shape or a ring shape. All the recesses communicate with each other such that the gas diffuses in a horizontal direction.

In the embodiment, the plurality of gas ejection holes **18*h* are formed in the dielectric plate as the upper dielectric 181. The gas ejection holes 18*h* are holes for ejecting the gas from the gas supply device 42 into the space SP. Each of the plurality of gas ejection holes 18*h* penetrates the dielectric plate from the upper surface to the lower surface of the dielectric plate. Each of the plurality of gas ejection holes 18*h* includes an upper hole 18$h_1$ and a lower hole 18$h_2$ communicating with each other. The upper hole 18$h_1$ is provided in the upper surface of the dielectric plate. The lower hole 18$h_2$ is provided in the lower surface of the dielectric plate. In the gas ejection holes 18*h*, the upper holes 18$h_1$ are large-diameter portions and the lower holes 18$h_2$ are small-diameter portions. The diameter of the upper holes 18*h*1 is larger than the diameter of the lower holes 18**$h_2$.

In each of the plurality of gas ejection holes **18*h*, the small-diameter lower hole 18$h_2$ extends below the large-diameter upper hole 18$h_1$ and communicates with the large-diameter upper hole 18$h_1$. The upper hole 18$h_1$ communicates with the gas diffusion space 225. The lower hole 18$h_2$ communicates with the space SP. The large-diameter upper holes 18$h_1$ of the plurality of gas ejection holes 18*h* have lengths that are adjusted to increase depending on the magnitude of the thickness of the dielectric plate at the portions where the gas ejection holes 18*h* are formed. In the plurality of gas ejection holes 18*h*, lengths L1 of the plurality of lower holes 18**$h_2$ are aligned with each other and are substantially identical to each other.

The dielectric plate (the upper dielectric 181), which is the main body of the shower plate 18, is made of a dielectric made of, for example, ceramic. The conductive film 141, which functions as an upper electrode, is provided on the upper surface of the upper dielectric 181. One or more annular sealing materials 126 are provided on the upper surface of the outer peripheral portion of the conductive film 141. In this example, among the plurality of sealing materials 126, the inwardly-located sealing material 126 is an elastic member (an O-ring), and the outwardly-located sealing material 126 is a conductive elastic member (a spiral shield). In addition, an elastic member (O-ring) is provided as another sealing material 125 between the upper dielectric

181 and the introduction portion 16 at a position below the inwardly-located sealing material 126. The conductive film 141 as an upper electrode is in electrical contact with the lower surface of the bulk upper electrode 14 via the sealing material 126. Since the bulk upper electrode 14 is connected to the radio-frequency power supply 30 via the matcher 32, a radio-frequency voltage is applied between the conductive film 141 and the ground potential.

The material of the upper dielectric 181 as a dielectric plate is ceramic. The material constituting the upper dielectric 181 may include at least one selected from a dielectric group consisting of aluminum nitride (AlN), aluminum oxide ($Al_2O_3$), and yttrium oxide ($Y_2O_3$). In this example, the aluminum nitride is used, but other materials may be used as the material of the dielectric.

The material of the conductive film 141 is, for example, aluminum, nickel, stainless steel, tungsten, molybdenum, copper, or gold. The material of the conductive film 141 may be deposited on the upper surface of the upper dielectric 181 through thermal spraying, sputtering, or chemical vapor deposition (CVD).

The corrosion-resistant film may be formed on at least the lower surface of the upper dielectric 181 (the dielectric plate) constituting the shower plate. The corrosion-resistant film may include at least one selected from a group consisting of yttrium oxide film, yttrium oxyfluoride, and yttrium fluoride. Other ceramic materials may also be used for the corrosion-resistant film.

Figure 2:
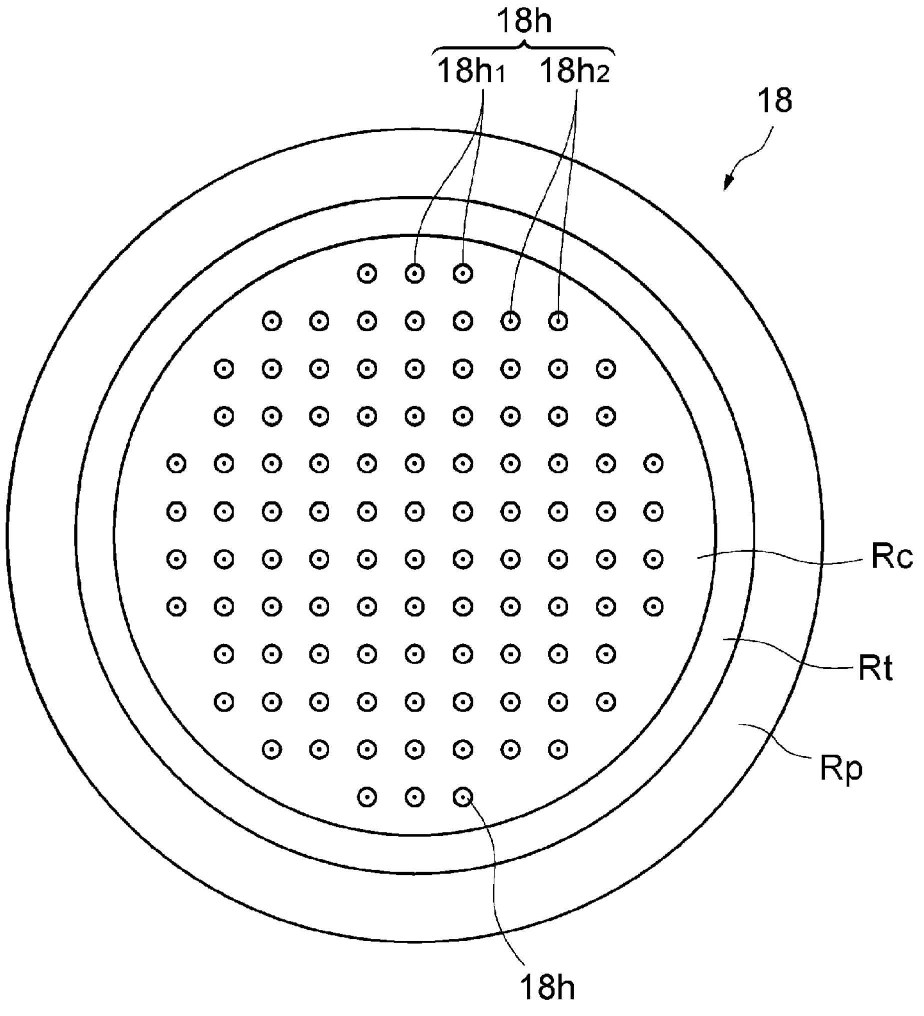
FIG. 2 is a plan view illustrating a shower plate according to an exemplary embodiment.

FIG. 2 is a plan view illustrating a shower plate according to an exemplary embodiment.

The main body of the shower plate 18 is the upper dielectric 181 as a dielectric plate, and has three regions of a central portion Rc, a transition portion Rt, and an outer peripheral portion Rp in a plan view. The transition portion Rt and the outer peripheral portion Rp are arranged concentrically so as to surround the central portion Rc. Upper and lower surfaces of the central portion Rc are flat and have a constant thickness Dc. Upper and lower surfaces of the outer peripheral portion Rp are flat and have a constant thickness Dp. The upper surface of the transition portion Rt is a surface including an inclined surface connecting the central portion Rc and the outer peripheral portion Rp, and the lower surface of the transition portion Rt is flat. A thickness Dt of the transition portion Rt decreases in a direction away from the central portion Rc. In FIG. 2, a side surface of the transition portion Rt has a shape in which a side surface of a truncated cone, the bottom of which has the same diameter as a cylinder, is continuous on a cylindrical surface, which is the side surface of the cylinder. The transition portion Rt may be formed by chamfering and polishing a corner portion of a boundary stepped portion between the central portion Rc and the outer peripheral portion Rp such that the corner portion is rounded. The side surface of the transition portion Rt may have the shape of a side surface of a simple truncated cone.

As described above, the shower plate 18 includes the upper dielectric 181 and the conductive film 141. The upper dielectric 181 has the plurality of through-holes for gas injection (gas ejection holes). The conductive film is provided on the upper surface of the upper dielectric 181, and has holes aligned with the through-holes of the upper dielectric 181. The upper surface of the upper dielectric 181 has a stepped portion between the central portion Rc and the outer peripheral portion Rp of the upper dielectric 181 so that the outer peripheral portion Rp is lower than the central portion Rc. Sheath electric fields that generate plasma tend to be strong in the central portion of the stage, and tend to be weak in the outer peripheral portion Rp since electric field vectors are inclined. In the outer peripheral portion Rp, the upper surface of the conductive film 141 has the stepped portion as described above. The conductive film 141 functions as an upper electrode during plasma generation to form electric fields via the upper dielectric 181 located directly below the conductive film 141 so as to correct the strength of the electric field vectors, thus improving the in-plane uniformity of the sheath electric fields. This improves the in-plane uniformity of plasma.

The lower surface of the upper dielectric 181 is flat. In addition, the upper dielectric 181 as a dielectric plate includes the central portion Rc and the outer peripheral portion Rp, and the upper surfaces of the central portion Rc and the outer peripheral portion Rp are flat. Thus, the upper surfaces are used as flat portions. The thickness of the central portion Rc is larger than that of the outer peripheral portion Rp. The gas ejection holes (through-holes) are provided in the flat portions. In addition, the upper surface of the central portion is flat, and the upper surface of the outer peripheral portion is also flat. Since the flat surfaces are easy to process, it is possible to achieve the above-mentioned effects only by forming the stepped portion at the boundary therebetween. The gas ejection holes **18*h*** (through-holes) may be provided in the flat portions. Since the through-holes in the flat portions are easy to process, it is possible to arrange the through-holes at accurate desired positions.

The upper dielectric 181 as a dielectric plate includes the transition portion Rt constituting the stepped portion between the central portion Rc and the outer peripheral portion Rp. The thickness of the conductive film 141 on the transition portion Rt is different from that of the conductive film 141 on the flat portion. When a sputtering method is used, the angles at which the material of the conductive film 141 collides with the dielectric plate are different. Due to the angle of the material of the conductive film 141 from the direction along the normal of the surface of the conductive film, the thickness of the conductive film is larger in the transition portion than in the flat portions. When the thickness is large, the effect of reducing the resistance to a current flowing perpendicularly in the thickness direction is obtained.

The through-holes (the gas ejection holes **18*h*) in the upper dielectric 181 as the dielectric plate and the through-holes in the conductive film 141 are aligned in the vertical direction. The through-holes in the conductive film 141, which are arranged at the positions of the gas ejection holes 18*h* in the dielectric plate, have a tapered shape having a diameter that becomes smaller in the direction toward the dielectric plate. Since the through-holes in the conductive film have a tapered shape, a gas easily flows into the gas ejection holes 18*h* in the dielectric plate, and the material of the conductive film hardly affects the gas passing through the gas ejection holes 18*h*** in the dielectric plate.

In an exemplary embodiment, the plasma processing method using the plasma processing apparatus described above includes the step of placing the substrate under the dielectric plate and the step of generating plasma by applying the radio-frequency voltage to the conductive film (between the conductive film and the ground) so as to process the surface of the substrate. In this case, it is possible to process the substrate with high in-plane uniformity. The surface process differs depending on the type of gas introduced into the processing container. When the gas is an etching gas, the surface of the substrate is etched, and when the gas is a film forming gas, a film corresponding to the type of gas is formed on the surface of the substrate.

Figure 3:
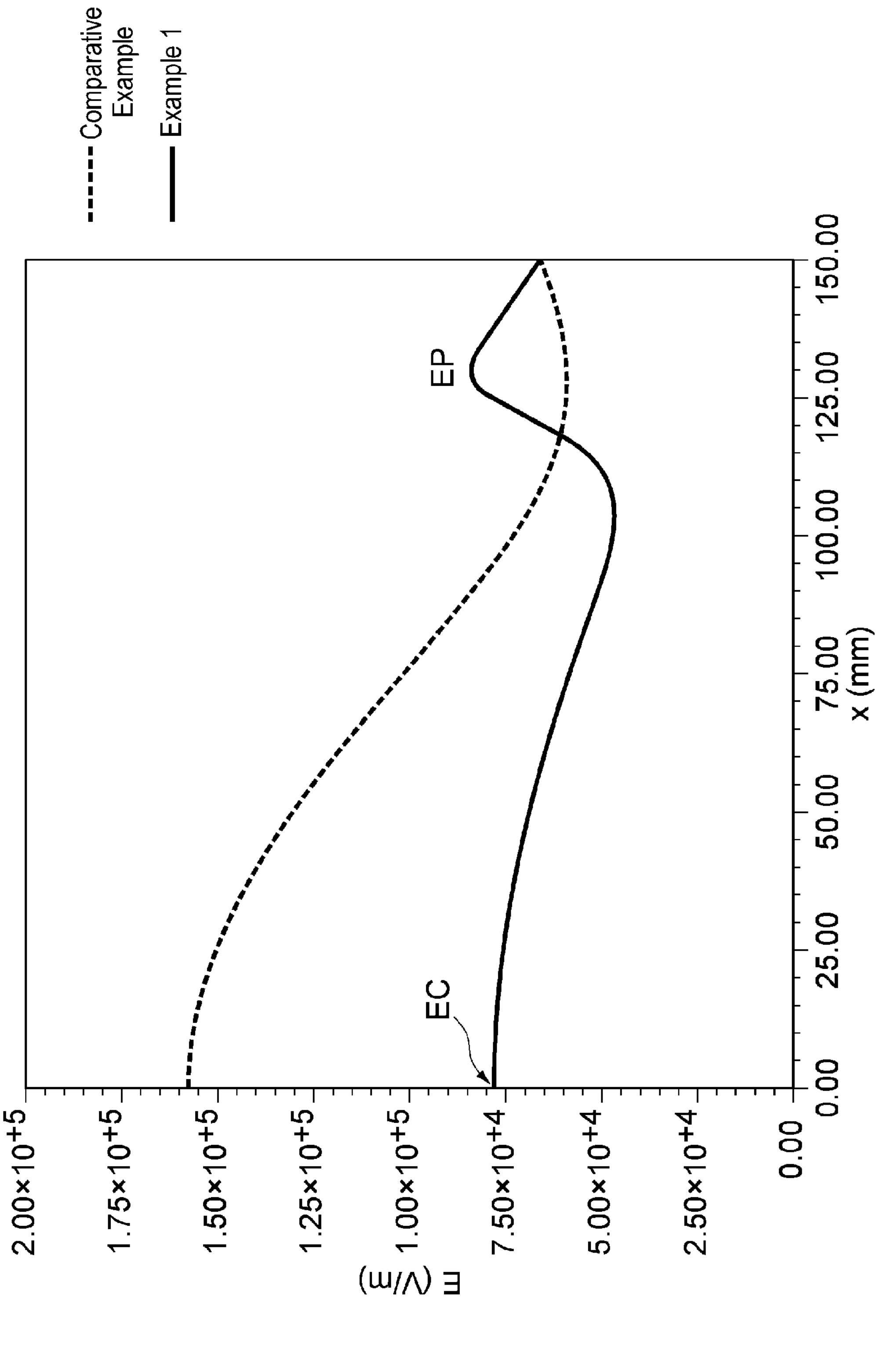
FIG. 3 is a graph showing a relationship between a distance x (mm) from the center of the shower plate in a radial direction and an electric field E (V/m).

FIG. 3 is a graph showing a relationship between a distance x (mm) from the center of the shower plate in the radial direction and an electric field E (V/m). The electric field E is a sheath electric field formed below the shower plate. The distance from the center of the shower plate 18 in the radial direction is assumed to be x.

FIG. 3 shows data of Example 1 and Comparative Example. In Example 1, VHF waves were used as a radio-frequency voltage, and the radio-frequency voltage for plasma generation was applied between the conductive film 141 and the ground potential. Assuming that a difference between a sheath electric field EC generated directly below the center of the central portion Rc and a sheath electric field EP generated directly below the outer peripheral portion Rp is ΔE=(EC−EP), the absolute value of ΔE=(EC−EP) in this example is $3.5\times10^4$ (V/m) or less. In Example 1, the diameter of the upper dielectric 181 as a dielectric plate is 300 mm, the material of the upper dielectric 181 is AlN, a thickness Dc of the central portion Rc is 2.0 cm, and a thickness Dp of the outer peripheral portion Rp is 0.5 cm. The conductive film was formed through thermal spraying of Al. In Comparative Example, unlike Example 1, the thickness of the dielectric plate was constant at a level of 0.5 cm. As is clear from the graph, in Comparative Example, the sheath electric field differs greatly between the central portion and the outer peripheral portion (ΔE $1\times10^3$ (V/m)), but in Example 1, the electric field difference ΔE is remarkably smaller than that in Comparative Example. In this example, when the value of Dc−Dp is 1.5 cm to 2.0 cm, it is considered that the in-plane uniformity of plasma is high.

The above-mentioned plasma processing apparatus includes the shower plate 18 and the lower electrode (the stage 12 or the conductive layer built in the stage). The processing container 10 accommodates the shower plate 18 and the lower electrode. Since the radio-frequency voltage is applied between the conductive film 141 as the upper electrode and the lower electrode, plasma is generated therebetween. It is possible to adjust the orientation and strength of the electric field vectors depending on the above-mentioned stepped portion, that is, the distance between the lower surface of the upper dielectric 181 and the conductive film 141. This adjustment improves the in-plane uniformity of plasma. The central portion is flat, and the outer peripheral portion is also flat. Since the flat surfaces are easy to process, it is possible to achieve the above-mentioned effects only by forming the stepped portion at the boundary between central portion and the outer peripheral portion.

In the above description, the number of stepped portions on the upper surface of the shower plate was one, but may be 2 or more. When the number of stepped portions is small, there is an advantage in that the number of steps for processing the stepped portions is small, and when the number of stepped portions is large, there is an advantage in that it is possible to control the difference between the electric fields more precisely.

Although various exemplary embodiments have been described above, the present disclosure is not limited to the exemplary embodiments described above, and various omissions, substitutions, and changes may be made. In addition, elements in different embodiments may be combined to form other embodiments. From the foregoing description, it should be understood that various embodiments of the present disclosure have been described herein for purposes of illustration, and that various modifications can be made without departing from the scope and spirit of the present disclosure. Accordingly, the various embodiments disclosed herein are not intended to be limiting, and the true scope and spirit of the present disclosure are indicated by the appended claims.

EXPLANATION OF REFERENCE NUMERALS

1: plasma processing apparatus, 10: processing container, 10*e*: exhaust port, 12: stage (lower electrode), 14: upper electrode, 141: conductive film (upper electrode), 16: introduction portion, 18: shower plate, 181: dielectric plate (upper dielectric), 18*h*: gas ejection hole, 24: cylindrical member, 25: sealing member, 26: sealing member, 30: radio-frequency power supply, 32: matcher, 40: pipe, 42: gas supply device, 201: waveguide, 225: gas diffusion space, RF: waveguide passage, SP: space, W: substrate

What is claimed is:

1. A plasma processing apparatus comprising:

a processing container;

a stage;

a dielectric plate including a central portion, an outer peripheral portion, and a transition portion that constitutes a stepped portion between the central portion and the outer peripheral portion;

an upper electrode disposed above the dielectric plate; and a gas diffusion space between the upper electrode and the dielectric plate;

wherein the gas diffusion space conforms to a contour of the dielectric plate;

wherein the stage is provided within the processing container, the dielectric plate includes a plurality of through-holes for gas injection, an upper surface of the dielectric plate is provided with a conductive film, a space between the conductive film and the stage within the processing container is used as a plasma processing space, upper surfaces of the central portion and the outer peripheral portion include flat portions, the central portion is larger in thickness than the outer peripheral portion, an upper surface of the transition portion is a surface including an inclined surface connecting the central portion and the outer peripheral portion, and a lower surface of the transition portion includes a flat portion, and from a direction along a normal of a surface of the conductive film, a thickness of the conductive film on the transition portion is larger than thicknesses of the conductive film on both the flat portion of the central portion and the flat portion of the outer peripheral portion.

2. The plasma processing apparatus of claim 1, wherein the plurality of through-holes for gas injection are provided in the flat portions.

3. The plasma processing apparatus of claim 2, wherein through-holes in the conductive film are arranged at positions of the plurality of through-holes for gas injection of the dielectric plate and include lower holes and upper holes whose diameter is larger than a diameter of the lower holes.

4. The plasma processing apparatus of claim 1, wherein through-holes in the conductive film are arranged at positions of the plurality of through-holes for gas injection of the dielectric plate and include lower holes and upper holes whose diameter is larger than a diameter of the lower holes.

* * * * *